(12) United States Patent
Takemura et al.

(10) Patent No.: US 8,865,391 B2
(45) Date of Patent: Oct. 21, 2014

(54) CHEMICALLY AMPLIFIED NEGATIVE RESIST COMPOSITION, PHOTO-CURABLE DRY FILM, MAKING METHOD, PATTERN FORMING PROCESS, AND ELECTRIC/ELECTRONIC PART PROTECTING FILM

(71) Applicant: Shin-Etsu Chemical Co., Ltd., Tokyo (JP)

(72) Inventors: Katsuya Takemura, Joetsu (JP); Takashi Miyazaki, Joetsu (JP); Hiroyuki Urano, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 50 days.

(21) Appl. No.: 13/705,425

(22) Filed: Dec. 5, 2012

(65) Prior Publication Data
US 2013/0149645 A1 Jun. 13, 2013

(30) Foreign Application Priority Data

Dec. 9, 2011 (JP) ................................ 2011-270001

(51) Int. Cl.
G03F 7/028 (2006.01)
G03F 7/075 (2006.01)
G03F 7/26 (2006.01)
G03F 7/20 (2006.01)
G03F 7/16 (2006.01)
G03F 7/038 (2006.01)
G03F 7/40 (2006.01)

(52) U.S. Cl.
CPC ............ G03F 7/0757 (2013.01); G03F 7/2002 (2013.01); G03F 7/161 (2013.01); G06F 7/038 (2013.01); G03F 7/0382 (2013.01); G03F 7/40 (2013.01)
USPC .................. 430/280.1; 430/283.1; 430/270.1; 430/325; 430/330; 430/273.1; 430/14; 430/18

(58) Field of Classification Search
None
See application file for complete search history.

(56) References Cited

U.S. PATENT DOCUMENTS

| | | | |
|---|---|---|---|
| 3,159,601 A | 12/1964 | Ashby | |
| 3,159,662 A | 12/1964 | Ashby | |
| 3,220,972 A | 11/1965 | Lamoreaux | |
| 3,775,452 A | 11/1973 | Karstedt | |
| 5,476,752 A * | 12/1995 | Noguchi et al. | ........... 430/287.1 |
| 6,838,229 B2 | 1/2005 | Washio et al. | |
| 7,700,403 B2 | 4/2010 | Arai et al. | |
| 7,714,033 B2 * | 5/2010 | Ito et al. | ........................... 522/63 |
| 7,785,766 B2 | 8/2010 | Kato et al. | |
| 2004/0106064 A1 | 6/2004 | Choi | |

FOREIGN PATENT DOCUMENTS

| | | |
|---|---|---|
| EP | 2 105 796 A1 | 9/2009 |
| JP | 2003-114531 A | 4/2003 |
| JP | 2007-065488 A | 3/2007 |
| JP | 2008-184571 A | 8/2008 |
| JP | 2009-200315 A | 9/2009 |

OTHER PUBLICATIONS

English translation of JP 2007-065488, A (2007) from machine translation from AIPN Japan Patent Office National Center for Industrial Property Information and Training, generated Feb. 5, 2014, 19 pages.*

Extended European Search Report dated Apr. 4, 2013, issued in corresponding European Patent Application No. 12196245.0.

* cited by examiner

*Primary Examiner* — Cynthia Hamilton
(74) *Attorney, Agent, or Firm* — Westerman, Hattori, Daniels & Adrian, LLP

(57) ABSTRACT

A chemically amplified negative resist composition is provided comprising (A) a resin having a crosslinking group, (B) a crosslinker, (C) a photoacid generator capable of generating an acid upon exposure to light of wavelength 190-500 nm, (D) a solvent, and (E) an isocyanuric acid. The resist composition overcomes the stripping problem that the film is stripped from metal wirings of Cu or Al, electrodes, and SiN substrates.

16 Claims, 1 Drawing Sheet

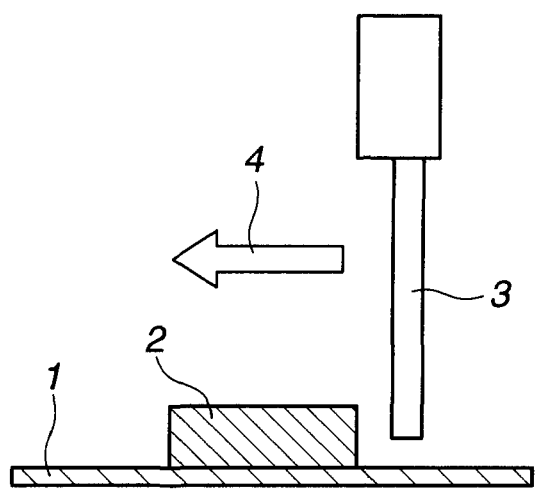

CHEMICALLY AMPLIFIED NEGATIVE RESIST COMPOSITION, PHOTO-CURABLE DRY FILM, MAKING METHOD, PATTERN FORMING PROCESS, AND ELECTRIC/ELECTRONIC PART PROTECTING FILM

CROSS-REFERENCE TO RELATED APPLICATION

This non-provisional application claims priority under 35 U.S.C. §119(a) on Patent Application No. 2011-270001 filed in Japan on Dec. 9, 2011, the entire contents of which are hereby incorporated by reference.

TECHNICAL FIELD

This invention relates to a chemically amplified negative resist composition which can be patterned by exposure to ultraviolet radiation in near-UV and deep-UV regions having a wavelength below 500 nm such as i and g-line; a photo-curable dry film using the composition; a method of preparing the photo-curable dry film; a process of forming a pattern by using the resist composition, forming a photo-curable resin layer on a substrate and patterning; and a film for the protection of parts (e.g., wirings, circuits and boards) using a cured film of the photo-curable resin layer.

Patterns formed from dry films comprising a negative resist composition are used to cover wirings, circuits, boards or the like as protective film. However, when patterns formed of a negative resist composition are applied to wirings, circuit-forming metal (typically Cu) layers, metal (typically Al) electrodes on substrates, or SiN substrates (serving as dielectric substrates bearing wirings or circuits to be covered), a stripping problem often arises that the patterns are stripped from the underlying substrate owing to poor adhesion. Surprisingly, a pattern formed of a chemically amplified negative resist composition according to the invention or a dry film comprising the composition is significantly improved in adhesion to substrate.

Owing to its advantages including heat resistance, chemical resistance, insulation and flexibility, the protective film formed of the resist composition of the invention finds use as dielectric film for semiconductor devices including redistribution, dielectric film for multilayer printed boards, solder mask, cover lay film, dielectric film for filling in through-silicon vias (TSV), and lamination of substrates.

BACKGROUND ART

As most electronic equipment including personal computers, digital cameras and mobile phones become of smaller size and better performance, there is an increasing demand for semiconductor devices of small size, thin profile and high density. There is a desire to have a photosensitive dielectric material which can accommodate an increase of substrate area for productivity improvement and which can accommodate structures having fine asperities with a high aspect ratio on substrates in the high-density packaging technology as typified by chip size packages or chip scale packages (CSP) or 3D layer stacks.

As the photosensitive dielectric material mentioned above, JP-A 2008-184571 discloses a photo-curable resin composition which can be coated to form films having a widely varying thickness by the spin coating technique commonly used in the semiconductor device fabrication, processed into fine size patterns using radiation of a wide wavelength range, and post-cured at low temperatures into electric/electronic part-protecting films having flexibility, heat resistance, electric properties, adhesion, reliability and chemical resistance. Advantageously, the spin coating technique is capable of simply forming a film on a substrate. This photo-curable resin composition for forming electric/electronic part-protecting films is used to form a film having a thickness of 1 to 100 μm on a substrate. As the film thickness increases beyond 30 μm, it becomes difficult to apply the photo-curable resin composition onto the substrate by spin coating because the composition must have a very high viscosity. The film formation on substrate by spin coating encounters a certain limit in the practical application.

Also, when the photo-curable resin composition is applied onto a substrate having a rugged surface by spin coating, it is difficult to form a uniform layer on the substrate. The photo-curable resin layer tends to leave voids near steps on the substrate. Further improvements in planarity and step coverage are desired. Another coating technique replacing the spin coat technique is spray coating as disclosed in JP-A 2009-200315. Owing to the principle of spraying, defects are often formed including height difference arising from asperities on the substrate, film rupture at pattern edges and pinholes at recess bottom. The problems of planarity and step coverage still remain unsolved.

Recently, in the high-density package technology as typified by chip scale packages (CSP) or 3D stacked packages, a focus is put on the technique of redistribution from chips by forming a fine, high aspect ratio pattern on a substrate and depositing a metal such as copper on the pattern. To meet a demand for chips of higher density and high integration, it is strongly desired to reduce the width of pattern lines and the size of contact holes for interconnection between substrates. The lithography is generally used for forming fine size patterns. In particular, the lithography combined with chemically amplified resist compositions is best suited for forming fine pattern features. Since the pattern used for redistribution is permanently left between device chips, the pattern material must have a cure ability and also serve as an electric/electronic part-protecting film having flexibility, heat resistance, electric properties, adhesion, reliability and chemical resistance. For this reason, a negative resist composition is believed suitable for forming such patterns as described in JP-A 2003-114531.

Accordingly, a chemically amplified negative resist composition is typical of the pattern-forming material which can be processed into a fine redistribution layer and serve as an electric/electronic part-protecting film having flexibility, heat resistance, electric properties, adhesion, reliability and chemical resistance.

On the other hand, a chemically amplified negative resist composition can form a fine pattern as used in the redistribution technology and is useful as electric/electronic part-protecting film. The negative resist composition is thus often used to cover Cu wirings preformed on substrates, Al electrodes on substrates, or dielectric or SiN substrates having wirings or electrodes formed thereon. Sometimes, the negative resist composition must entirely cover the SiN substrate. Since the adhesion between the coating layer of the negative resist composition and the substrate is still insufficient, a stripping problem often arises that the coating layer is stripped from the substrate.

Accordingly, to meet a demand for chips of higher density and high integration, the chemically amplified negative resist composition which can form a fine size pattern for redistribution and is suitable as electric/electronic part-protecting film is strongly desired to improve the adhesion to substrate.

CITATION LIST

Patent Document 1: JP-A 2008-184571 (U.S. Pat. No. 7,785, 766)
Patent Document 2: JP-A 2009-200315 (U.S. Pat. No. 7,700, 403)
Patent Document 3: JP-A 2003-114531 (U.S. Pat. No. 6,838, 229)

SUMMARY OF INVENTION

A first object of the invention is to provide a chemically amplified negative resist composition which is suitable to form a fine size pattern and effective for overcoming the stripping problem that can be encountered on wirings and electrodes of metal (e.g., Cu or Al), semiconductor substrates and SiN substrates.

A second object is to provide a pattern forming process of forming a fine size pattern simply by spin coating the resist composition onto a substrate.

A third object is to provide a photo-curable dry film comprising the resist composition, a method of preparing the dry film, and a pattern forming process capable of forming a resist layer having a widely varying thickness even on a substrate having a rugged surface, using the photo-curable dry film.

A fourth object is to provide a protective film for electric and electronic parts such as wirings, circuits and boards, comprising a cured film obtained by post-curing at low temperature of the pattern resulting from the pattern forming process.

In a first aspect, the invention provides a chemically amplified negative resist composition comprising (A) a resin having a crosslinking group or a reaction site susceptible to crosslinking reaction within the molecule, (B) a crosslinker, (C) a photoacid generator which is decomposed to generate an acid upon exposure to light of wavelength 190 to 500 nm, (D) a solvent, and (E) an isocyanuric acid of the structure having the general formula (1).

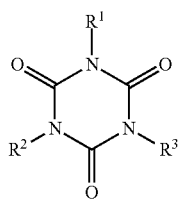

(1)

Herein $R^1$, $R^2$ and $R^3$ may be the same or different, at least one of $R^1$, $R^2$ and $R^3$ is a crosslinking group or a monovalent organic group having a reaction site susceptible to crosslinking reaction and the remaining is a monovalent hydrocarbon group of 1 to 20 carbon atoms.

In a preferred embodiment, component (A) is a silicone structure-bearing polymer comprising recurring units of the general formula (2) and having a weight average molecular weight of 3,000 to 500,000.

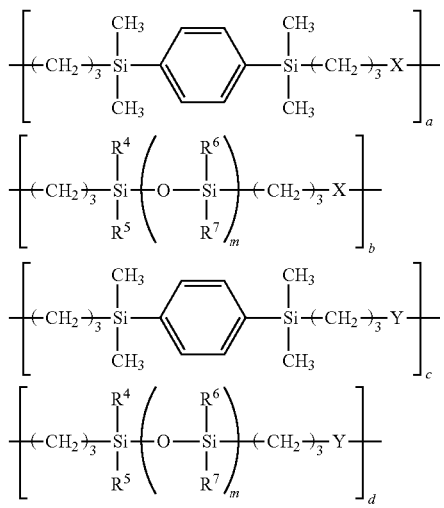

(2)

Herein $R^4$ to $R^7$ are each independently a monovalent $C_1$-$C_8$ hydrocarbon group, m is an integer of 1 to 100, a, b, c and d each are 0 or a positive number, with the proviso that a, b, c and d are not equal to 0 at the same time, and a+b+c+d=1. X is a divalent organic group of the general formula (3):

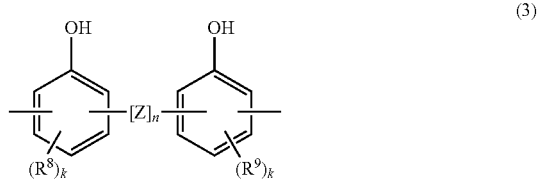

(3)

wherein Z is a divalent organic group selected from the following:

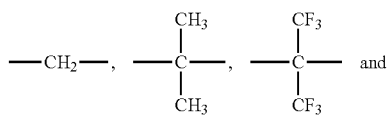

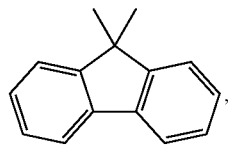

n is 0 or 1, $R^8$ and $R^9$ are each independently $C_1$-$C_4$ alkyl or alkoxy, and k is 0, 1, or 2. Y is a divalent organic group of the general formula (4):

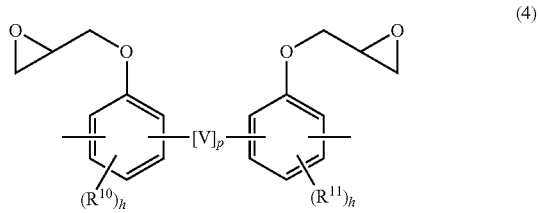

(4)

wherein V is a divalent organic group selected from the following:

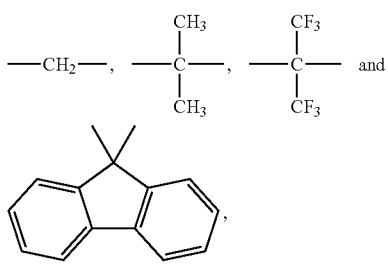

p is 0 or 1, $R^{10}$ and $R^{11}$ are each independently $C_1$-$C_4$ alkyl or alkoxy, and h is 0, 1, or 2. Also component (B) is at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group substituted by a glycidoxy group.

Preferably, $0.3 \le a \le 0.7$, $0.2 \le b \le 0.5$, $0 < c \le 0.2$, and $0 < d \le 0.2$; $0.2 \le a \le 0.8$, $0.2 \le b \le 0.8$, c=0 and d=0, and; b=1, and a, c and d are 0.

In a preferred embodiment, component (E) is an isocyanuric acid of the structure having formula (1) wherein at least one of $R^1$, $R^2$ and $R^3$ is a crosslinking group selected from methylol, alkoxymethylol, glycidyl, and vinyloxy groups, or an organic group having a reaction site susceptible to crosslinking reaction, represented by the general formula (5) or (6):

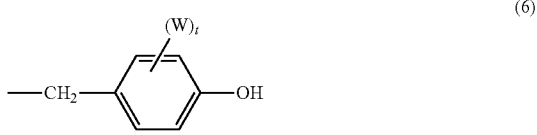

wherein s is an integer of 1 to 3, W is a straight or branched $C_1$-$C_4$ alkyl group, and t is 0 or an integer of 1 to 4.

As to component (E), any one of compounds having formulae (I) to (V) described later is preferably used.

The resist composition may further comprise a basic compound.

In a second aspect, the invention provides a pattern forming process comprising the steps of (1) coating the chemically amplified negative resist composition defined herein onto a substrate, and prebaking to form a resist film, (2) exposing the resist film to high-energy radiation of wavelength 190 to 500 nm or electron beam through a photomask, (3) baking and developing in a developer to pattern the resist film. The process may further comprise (4) post-curing the patterned resist film resulting from development step (3) at a temperature of 100 to 250° C.

In a third aspect, the invention provides a photo-curable dry film comprising a photo-curable resin layer having a thickness of 10 to 100 μm sandwiched between a support film and a protective film, the photo-curable resin layer being formed of a photo-curable resin composition which is the chemically amplified negative resist composition defined above.

In a fourth aspect, the invention provides a laminate comprising a substrate provided with grooves and/or holes having an opening width of 10 to 100 μm and a depth of 10 to 120 μm, and a layer lying on the substrate, the layer being a cured layer of the photo-curable resin composition extracted from the photo-curable dry film defined above.

In a fifth aspect, the invention provides a method of preparing a photo-curable dry film, comprising the steps of (i) continuously coating a photo-curable resin composition onto a support film, the photo-curable resin composition being the resist composition comprising components (A) to (E) as defined above, (ii) drying the photo-curable resin composition to form a photo-curable resin layer on the support film, and (iii) applying a protective film onto the photo-curable resin layer.

In a sixth aspect, the invention provides a pattern forming process comprising the steps of (i) stripping the protective film from the photo-curable dry film defined above and placing the bare photo-curable resin layer in close contact with a substrate, (ii) exposing the photo-curable resin layer to radiation of wavelength 190 to 500 nm through a photomask and through the support film or with the support film stripped off, (iii) post-exposure bake, (iv) developing in a developer to pattern the layer, and optionally, (v) post-curing the patterned layer resulting from development step (iv) at a temperature of 100 to 250° C.

Typically, the substrate is provided with grooves and/or holes having an opening width of 10 to 100 μm and a depth of 10 to 120 μm.

In a seventh aspect, the invention provides a film for the protection of electric and electronic parts, which is obtained from the photo-curable dry film defined above.

Advantageous Effects of Invention

The chemically amplified negative resist composition substantially overcomes the stripping problem that can be encountered on wirings and electrodes of metal (e.g., Cu or Al), semiconductor substrates and SiN substrates. The chemically amplified negative resist composition, photo-curable dry film and pattern forming process according to the invention can form a fine pattern using radiation over a wide span of wavelength, can reduce the size of pattern features in the redistribution technology to meet the demand for chips of higher density and higher integration, and are useful to form an electric/electronic part-protecting film.

BRIEF DESCRIPTION OF DRAWINGS

The only FIGURE, FIG. 1 schematically illustrates how to examine adhesion in Examples.

DESCRIPTION OF PREFERRED EMBODIMENTS

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

Mw: weight average molecular weight
Mn: number average molecular weight

Mw/Mn: molecular weight distribution or dispersity
GPC: gel permeation chromatography
PEB: post-exposure baking
PAG: photoacid generator Chemically Amplified Negative Resist Composition and Pattern Forming Process A first embodiment of the invention is a chemically amplified negative resist composition comprising (A) a resin having a crosslinking group or a reaction site susceptible to crosslinking reaction within the molecule,
(B) a crosslinker,
(C) a photoacid generator which is decomposed to generate an acid upon exposure to light of wavelength 190 to 500 nm,
(D) a solvent, and
(E) an isocyanuric acid.

Component (A) is preferably a silicone structure-bearing polymer comprising recurring units of the general formula (2) and having a weight average molecular weight of 3,000 to 500,000.

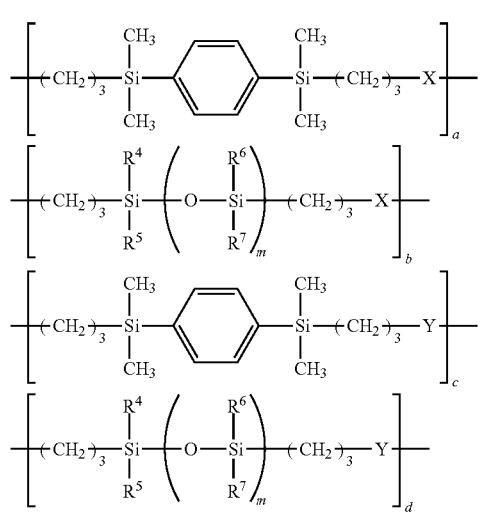

Herein $R^4$ to $R^7$ are each independently a monovalent hydrocarbon group of 1 to 8 carbon atoms, preferably 1 to 6 carbon atoms. Examples include straight, branched or cyclic alkyl groups such as methyl, ethyl, propyl, isopropyl, n-butyl, tert-butyl, and cyclohexyl; straight, branched or cyclic alkenyl groups such as vinyl, allyl, propenyl, butenyl, hexenyl, and cyclohexenyl; aryl groups such as phenyl and tolyl; and aralkyl groups such as benzyl and phenylethyl.

From the standpoints of compatibility with the crosslinker and PAG to be described later and photo-curability, m is an integer of 1 to 100, preferably 1 to 80. Also, from the standpoints of adhesion to substrate, electric properties and reliability, a, b, c and d each are 0 or a positive number, with the proviso that a, b, c and d are not equal to 0 at the same time. Preferably, a, b, c and d are in the range: $0 \le a \le 0.8$, more preferably $0.2 \le a \le 0.8$, and even more preferably $0.3 \le a \le 0.7$; $0 \le b \le 1.0$, more preferably $0.2 \le b \le 0.8$, and even more preferably $0.2 \le b \le 0.5$; $0 \le c \le 0.3$, more preferably $0 \le c \le 0.2$; $0 \le d \le 0.3$, more preferably $0 \le d \le 0.2$. It is noted that $a+b+c+d=1$.

The preferred ranges of a, b, c and d are as defined above. Particularly preferred are the range that in case of b=1, a, c and d are all equal to 0; the range that in case of $0.2 \le a \le 0.8$ and $0.2 \le b \le 0.8$, both c and d are equal to 0; and the range where $0.3 \le a \le 0.7$, $0.2 \le b \le 0.5$, $0 < c \le 0.2$, and $0 < d \le 0.2$.

X is a divalent organic group having a phenolic hydroxyl group represented by the general formula (3).

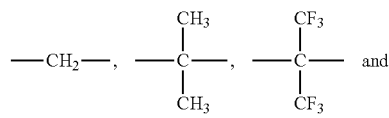

Herein Z is a divalent organic group selected from the following:

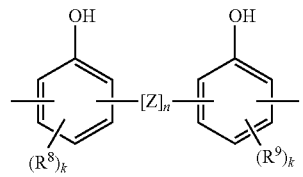

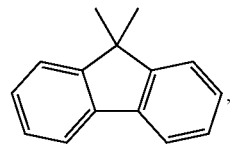

n is 0 or 1, $R^8$ and $R^9$ are each independently $C_1$-$C_4$ alkyl or alkoxy, and k is 0, 1, or 2. Exemplary of $R^8$ and $R^8$ are methyl, ethyl, isopropyl, tert-butyl, methoxy, ethoxy and isopropyloxy.

Y is a divalent aromatic group having a glycidoxy group represented by the general formula (4).

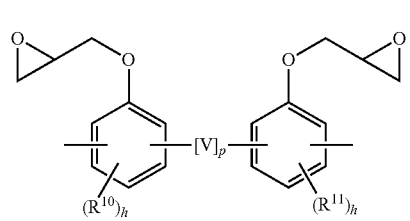

Herein V is a divalent organic group selected from the following:

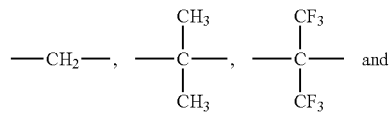

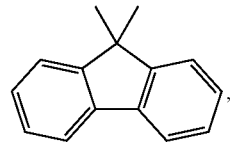

p is 0 or 1, $R^{10}$ and $R^{11}$ are each independently $C_1$-$C_4$ alkyl or alkoxy, and h is 0, 1, or 2. Suitable examples of $R^{10}$ and $R^{11}$ are as exemplified for $R^8$ and $R^9$.

The silicone structure-bearing polymer should have a Mw of 3,000 to 500,000, preferably 5,000 to 300,000 when the mechanical properties of a cured resin layer of a chemically amplified negative resist composition comprising the same are taken into account. It is noted that Mw is as measured by GPC versus polystyrene standards.

The silicone structure-bearing polymer may be prepared through polymerization reaction, known as "hydrosilylation," of a hydrogensilphenylene (or 1,4-bis(dimethylsilyl) benzene) represented by formula (7):

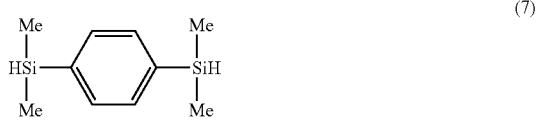

wherein Me is methyl and/or a dihydroorganosiloxane represented by formula (8):

wherein Me is methyl, $R^6$, $R^7$ and m are as defined above, with a specific epoxy compound having a diallyl group represented by formula (9):

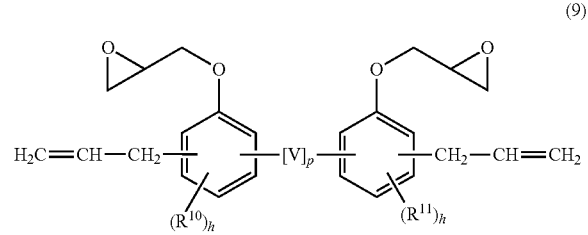

wherein V, $R^{10}$, $R^{11}$, p and h are as defined above, and/or a specific phenol compound having a diallyl group represented by formula (10):

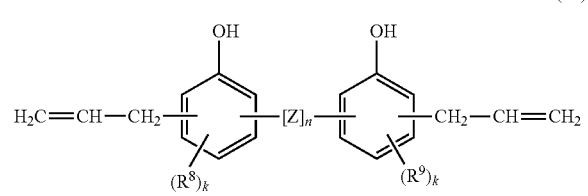

wherein Z, $R^8$, $R^9$, n and k are as defined above, in the presence of a catalyst.

The Mw of the silicone structure-bearing polymer may be easily controlled by adjusting a ratio of a total number of allyl groups available from the epoxy compound having a diallyl group of formula (8) and the phenol compound having a diallyl group of formula (9) to a total number of hydrosilyl groups available from the hydrogensilphenylene of formula (6) and the dihydroorganosiloxane of formula (7), that is, total allyl groups/total hydrosilyl groups. Alternatively, a polymer having the desired Mw may be easily produced by effecting polymerization of the epoxy compound having a diallyl group and the phenol compound having a diallyl group as well as the hydrogensilphenylene and the dihydroorganosiloxane while using a monoallyl compound such as o-allylphenol or a monohydrosilane or monohydrosiloxane such as triethylhydrosilane as a molecular weight modifier.

Preferred examples of the catalyst used in the polymerization reaction include platinum group metals alone such as platinum (inclusive of platinum black), rhodium and palladium; platinum chlorides, chloroplatinic acids and chloroplatinic acid salts such as $H_2PtCl_4\text{-}xH_2O$, $H_2PtCl_6\text{-}xH_2O$, $NaHPtCl_6\text{-}xH_2O$, $KHPtCl_6\text{-}xH_2O$, $Na_2PtCl_6\text{-}xH_2O$, $K_2PtCl_4\text{-}xH_2O$, $PtCl_4\text{-}xH_2O$, $PtCl_2$, $Na_2HPtCl_4\text{-}xH_2O$ wherein x is an integer of 0 to 6, especially 0 or 6; alcohol-modified chloroplatinic acid (U.S. Pat. No. 3,220,972); complexes of chloroplatinic acid with olefins (U.S. Pat. Nos. 3,159,601, 3,159,662 and 3,775,452); platinum group metals (e.g., platinum black and palladium) on alumina, silica, carbon or other supports; rhodium-olefin complexes; chlorotris(triphenylphosphine)rhodium, known as Wilkinson catalyst; and complexes of platinum chloride, chloroplatinic acid or chloroplatinic acid salt with vinyl-containing siloxanes, especially vinyl-containing cyclosiloxanes. The catalyst may be used in a catalytic amount, specifically in an amount of 0.001 to 0.1% by weight of platinum group metal based on the total weight of reactants to be polymerized.

If desired, an organic solvent may be used in the polymerization reaction. Suitable organic solvents include hydrocarbon solvents such as toluene and xylene.

With respect to polymerization conditions, the polymerization temperature is preferably in the range of 40 to 150° C., and more preferably 80 to 120° C. when it is considered that the catalyst is not deactivated and the polymerization is completed within a short time. The polymerization time may vary with the type and amount of a desired polymer. Preferably polymerization is completed within about 0.5 to 100 hours, and more preferably about 0.5 to 30 hours, in order to prevent moisture entry into the polymerization system. At the end of polymerization, the solvent is distilled off if the solvent is used. In this way, a silicone structure-bearing polymer comprising recurring units of formula (2) is obtained.

As the Mw of a silicone structure-bearing polymer lowers, its viscosity also lowers. As a result, a resin layer formed of a chemically amplified negative resist composition comprising that silicone structure-bearing polymer also lowers its viscosity. If a proportion of linear polysiloxane-containing molecular units (corresponding to units (b) and (d) in formula (2)) in the molecule of a silicone structure-bearing polymer increases, a proportion of aromatic compound-containing molecular units, typically silphenylene-containing molecular units (corresponding to units (a) and (c) in formula (2)) relatively decreases. Then the silicone structure-bearing polymer lowers its viscosity. As a result, a resin layer formed of a chemically amplified negative resist composition comprising that silicone structure-bearing polymer also lowers its viscosity. If the linear polysiloxane in the molecule of a silicone structure-bearing polymer increases its molecular chain length, that is, if the value of m in formula (2) increases, the silicone structure-bearing polymer lowers its viscosity. As a result, a resin layer formed of a chemically amplified negative resist composition comprising that silicone structure-bearing polymer may also lower its viscosity.

Component (B) is a crosslinker which is preferably one or more members selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group substituted by a glycidoxy group.

The amino condensate modified with formaldehyde or formaldehyde-alcohol includes, for example, melamine condensates modified with formaldehyde or formaldehyde-alcohol, and urea condensates modified with formaldehyde or formaldehyde-alcohol.

The modified melamine condensates are prepared, for example, by modifying a melamine monomer with formaldehyde into a methylol form in a well-known manner, and optionally, further modifying it with an alcohol into an alkoxy form, thereby yielding a modified melamine of the general formula (11) shown below. The alcohols used herein are lower alcohols, for example, alcohols having 1 to 4 carbon atoms.

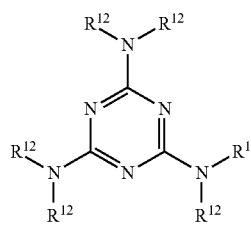

(11)

Herein, $R^{12}$, which may be the same or different, is a methylol group, an alkoxymethyl group containing a $C_1$-$C_4$ alkoxy moiety, or hydrogen, and at least one $R^{12}$ is a methylol or alkoxymethyl group. Specifically, $R^{12}$ is a methylol group, an alkoxymethyl group such as methoxymethyl or ethoxymethyl, or hydrogen.

Illustrative, non-limiting, examples of the modified melamine of formula (11) include trimethoxymethylmonomethylolmelamine, dimethoxymethylmonomethylolmelamine, trimethylolmelamine, hexamethylolmelamine, and hexamethoxymethylolmelamine.

Next, the modified melamine of formula (11) or an oligomer thereof (e.g., dimer or trimer) is subjected to addition condensation polymerization with formaldehyde in a customary way until a desired molecular weight is reached, thereby obtaining the formaldehyde or formaldehyde-alcohol-modified melamine condensate as component (B).

Also, the urea condensates modified with formaldehyde or formaldehyde-alcohol are prepared, for example, by modifying a urea condensate having a desired molecular weight with formaldehyde into a methylol form in a well-known manner, and optionally, further modifying it with an alcohol into an alkoxy form.

Illustrative examples of the modified urea condensate include methoxymethylated urea condensates, ethoxymethylated urea condensates, and propoxymethylated urea condensates. These modified melamine condensates and modified urea condensates may be used alone or in admixture of two or more.

Examples of the phenol compound having on the average at least two methylol or alkoxymethylol groups in a molecule include (2-hydroxy-5-methyl)-1,3-benzenedimethanol and 2,2',6,6'-tetramethoxymethylbisphenol A. These phenol compounds may be used alone or in admixture of two or more as the crosslinker.

Examples of the polyhydric phenol compound having a hydroxyl group substituted by a glycidoxy group include 1,1'-diglycidoxybisphenol A, tris(4-glycidoxyphenyl)methane, or 1,1,1-tris(4-glycidoxyphenyl)ethane which are obtained by reacting hydroxyl groups of bisphenol A, tris(4-hydroxyphenyl)methane, and 1,1,1-tris(4-hydroxyphenyl)ethane with epichlorohydrin in the presence of a base, respectively. These glycidoxy-substituted phenol compounds may also be used alone or in admixture of two or more as the crosslinker.

The crosslinker induces curing reaction with the silicone structure-bearing polymer for facilitating pattern formation and augmenting the strength of a cured product. The crosslinker should preferably have a weight average molecular weight (Mw) of about 150 to 10,000, and more preferably about 200 to 3,000, from the standpoints of photo-curability and heat resistance.

It is preferred from the standpoints of photo-curability and reliability of a protective film after post-curing that the crosslinker be used in an amount of 0.5 to 50 parts, and especially 1 to 30 parts by weight per 100 parts by weight of the silicone structure-bearing polymer (A).

The photoacid generator (C) is typically a compound which generates an acid upon exposure to light with a wavelength of 190 to 500 nm, the acid generated serving as a curing catalyst. Since the chemically amplified negative resist composition of the invention is highly compatible with the PAG, the PAG may be selected from a wide variety of such compounds. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Exemplary onium salts are compounds of the following general formula (12).

$(R^{13})_jM^+K^-$ (12)

Herein, $R^{13}$ is a straight, branched or cyclic $C_1$-$C_{12}$ alkyl group, $C_6$-$C_{12}$ aryl group or $C_7$-$C_{12}$ aralkyl group, which may have a substituent; $M^+$ is iodonium or sulfonium; $K^-$ is a non-nucleophilic counter-ion; and j is 2 or 3.

Illustrative examples of alkyl groups represented by $R^{13}$ include methyl, ethyl, propyl, butyl, cyclohexyl, 2-oxocyclohexyl, norbornyl, and adamantyl. Exemplary aryl groups include phenyl; alkoxyphenyl groups such as o-, m- or p-methoxyphenyl, ethoxyphenyl, m- or p-tert-butoxyphenyl; and alkylphenyl groups such as 2-, 3- or 4-methylphenyl, ethylphenyl, 4-tert-butylphenyl, 4-butylphenyl, and dimethylphenyl. Exemplary aralkyl groups include benzyl and phenethyl.

Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; and borates such as tetrakisphenylborate and tetrakis(pentafluorophenyl)borate.

Exemplary diazomethane derivatives are compounds of the following general formula (13).

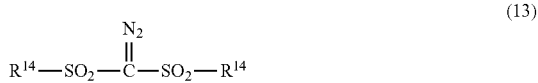

(13)

Herein, $R^{14}$, which may be the same or different, is a straight, branched or cyclic $C_1$-$C_{12}$ alkyl or haloalkyl group, $C_6$-$C_{12}$ aryl or haloaryl group, or $C_7$-$C_{12}$ aralkyl group.

Illustrative examples of alkyl groups represented by $R^{14}$ include methyl, ethyl, propyl, butyl, amyl, cyclopentyl, cyclohexyl, norbornyl, and adamantyl. Exemplary haloalkyl groups include trifluoromethyl, 1,1,1-trifluoroethyl, 1,1,1-trichloroethyl, and nonafluorobutyl. Exemplary aryl groups include phenyl; alkoxyphenyl groups such as o-, m- or p-methoxyphenyl, ethoxyphenyl, m- or p-tert-butoxyphenyl; and alkylphenyl groups such as 2-, 3- or 4-methylphenyl, ethylphenyl, 4-tert-butylphenyl, 4-butylphenyl, and dimethylphenyl. Exemplary haloaryl groups include fluorophenyl, chlorophenyl, and 1,2,3,4,5-pentafluorophenyl. Exemplary aralkyl groups include benzyl and phenethyl.

Illustrative examples of the PAG include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate, triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate, and
diphenyl(4-thiophenoxyphenyl)sulfonium hexafluoroantimonate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
oxime sulfonate derivatives such as
α-(benzenesulfoniumoxyimino)-4-methylphenylacetonitrile;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
imido-yl sulfonate derivatives such as
phthalimidoyl triflate, phthalimidoyl tosylate,
5-norbornene-2,3-dicarboxyimidoyl triflate,
5-norbornene-2,3-dicarboxyimidoyl tosylate,
5-norbornene-2,3-dicarboxyimidoyl n-butylsulfonate, and
n-trifluoromethylsulfonyloxynaphthylimide.

Also included are iminosulfonates such as
(5-(4-methylphenyl)sulfonyloxyimino-5H-thiophen-2-ylidene)-(2-methylphenyl)acetonitrile and
(5-(4-(4-methylphenylsulfonyloxy)phenylsulfonyloxyimino)-5H-thiophen-2-ylidene)-(2-methylphenyl)acetonitrile,
as well as 2-methyl-2[(4-methylphenyl)sulfonyl]-1-[(4-methyl-thio)phenyl]-1-propane.

Among others, imido-yl sulfonates, imino sulfonates and oxime sulfonates are preferred.

The PAGs may be used alone or in admixture of two or more. It is preferred from the standpoints of photo-absorption of the PAG itself and photo-curability of a thick film that the PAG be added in an amount of 0.05 to 20 parts by weight, and especially 0.2 to 5 parts by weight, per 100 parts by weight of the silicone structure-bearing polymer.

The solvent (D) used herein may be any organic solvent in which the silicone structure-bearing polymer (A), crosslinker (B) and PAG (C) are soluble.

Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more thereof.

Of these solvents, preferred are ethyl lactate, cyclohexanone, cyclopentanone, PGMEA, γ-butyrolactone, and mixtures thereof, in which the PAG is most soluble.

It is preferred from the standpoints of compatibility, viscosity and ease of coating of the resulting resist composition that the solvent (D) be used in an amount of 50 to 2,000 parts, and especially 100 to 1,000 parts by weight per 100 parts by weight of components (A) to (C) combined.

Component (E) is an isocyanuric acid, preferably of the structure having the general formula (1).

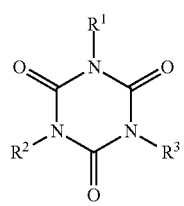

(1)

Herein $R^1$, $R^2$ and $R^3$ may be the same or different, at least one of $R^1$, $R^2$ and $R^3$ is a crosslinking group or a monovalent organic group having a reaction site susceptible to crosslinking reaction and the remaining is a monovalent hydrocarbon group of 1 to 20 carbon atoms.

As defined just above, at least one of $R^1$, $R^2$ and $R^3$ is a crosslinking group or an organic group having a reaction site susceptible to crosslinking reaction. Suitable crosslinking groups include methylol, alkoxymethylol, glycidyl, and vinyloxy groups. Exemplary of the alkoxymethylol group are methoxymethylol, ethoxymethylol and isopropoxymethylol. Since these crosslinking groups undergo crosslinking reaction in the presence of the acid catalyst generated by the PAG, the isocyanuric acid having a crosslinking group is suited as the additive to the negative resist composition. If an isocyanuric acid free of a crosslinking group is used, the adhesion of the corresponding resist composition is not improved and the negative pattern tends to be stripped from metal substrates of Cu or Al or dielectric substrates of SiN or the like. In particular, glycidyl substitution is preferred as the crosslinking group.

The organic groups having a reaction site susceptible to crosslinking reaction include groups having the general formulae (5) and (6):

(5)

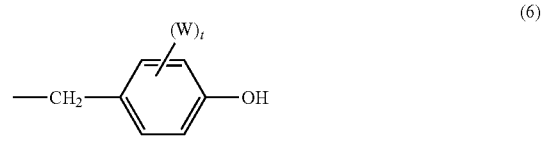

(6)

wherein s is an integer of 1 to 3, W is a straight or branched $C_1$-$C_4$ alkyl group, and t is 0 or an integer of 1 to 4.

Although the groups of formulae (5) and (6) are not organic groups capable of crosslinking reaction, they are preferable because the OH radical included in the groups of formulae (5) and (6) (in the case of a monovalent organic group having benzene ring, it must have hydrogen at ortho-position relative to the OH radical) can react with the crosslinker and the crosslinking group, typically glycidyl, in the resin in the presence of the acid catalyst generated by the PAG.

While at least one of $R^1$, $R^2$ and $R^3$ is a crosslinking group or a monovalent organic group having a reaction site susceptible to crosslinking reaction as mentioned above, the remaining (two, one or none) of $R^1$, $R^2$ and $R^3$ is a monovalent hydrocarbon group of 1 to 20 carbon atoms, preferably 1 to 12 carbon atoms, and more preferably 1 to 6 carbon atoms. As the carbon count increases, the isocyanuric acid may become more lipophilic and hence, less compatible with the other components of the resist composition. Also, as the carbon count increases, the organic group becomes bulky, making it difficult to exert the effect of improving adhesion to substrate. Exemplary hydrocarbon groups include straight, branched or cyclic alkyl groups such as methyl, ethyl, propyl, isopropyl, n-butyl, tert-butyl, and cyclohexyl, straight, branched or cyclic alkenyl groups such as vinyl, allyl, propenyl, butenyl, hexenyl and cyclohexenyl, aryl groups such as phenyl and tolyl, and aralkyl groups such as benzyl and phenylethyl.

Preferred examples of the isocyanuric acid include those of formulae (I) to (V) below.

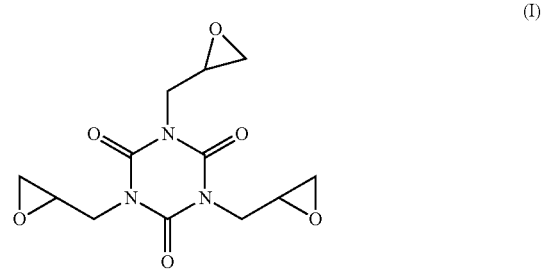

(I)

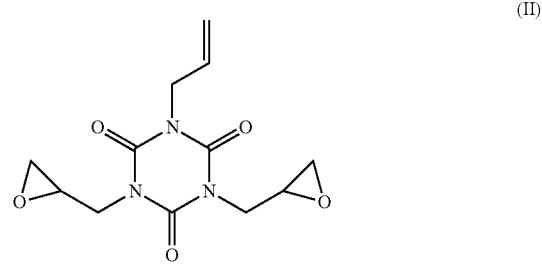

(II)

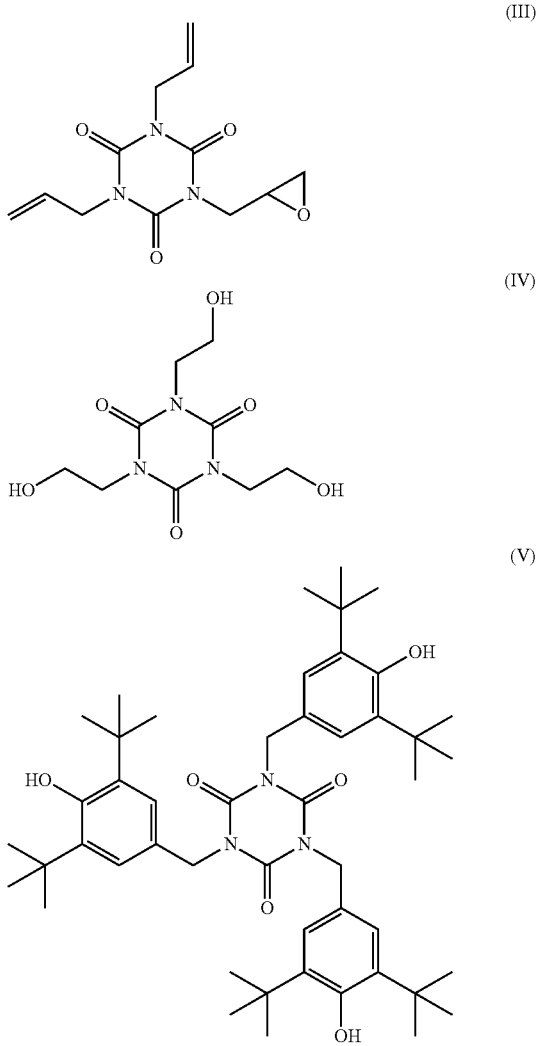

hydroxyl group; and side chain α is independently selected from substituent groups of the following general formulas (15) to (17), and two or three α's may bond together to form a ring.

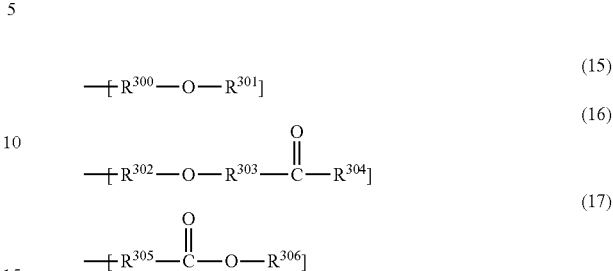

In the formulas, $R^{300}$, $R^{302}$ and $R^{305}$ are each independently a straight or branched $C_1$-$C_4$ alkylene group. $R^{301}$ and $R^{304}$ are each independently hydrogen, a straight, branched or cyclic $C_1$-$C_{20}$ alkyl group which may contain at least one hydroxyl group, ether bond, ester bond or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl group, ether bond, ester bond or lactone ring.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimida- The isocyanuric acid (E) is preferably used in an amount of 0.5 to 50 parts, and more preferably 0.5 to 10 parts by weight per 100 parts by weight of the silicone structure-bearing polymer (A). Less than 0.5 part of the isocyanuric acid may fail to exert the effect of enhancing adhesion between the cured layer or pattern and the substrate. Excess amounts of the isocyanuric acid may excessively increase the degree of crosslinking, which impedes material removal, resulting in a space or hole pattern with low resolution.

If desired, a basic compound may be added to the chemically amplified negative resist composition for improving resolution and fine pattern formation capability. Examples of the basic compound include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogenous compounds, amide derivatives, imide derivatives, and compound of the general formula (14).

$$N(\alpha)_q(\beta)_{3-q} \quad (14)$$

In formula (14), q is equal to 1, 2 or 3; side chain β is independently hydrogen or a straight, branched or cyclic $C_1$-$C_{20}$ alkyl group which may contain an ether bond or zole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds with sulfonyl group include 3-pyridinesulfonic acid and pyridinium p-toluenesulfonate.

Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide.

Suitable imide derivatives include phthalimide, succinimide, and maleimide.

Examples of the compounds of formula (14) include
tris[2-(methoxymethoxy)ethyl]amine,
tris[2-(2-methoxyethoxy)ethyl]amine,
tris[2-(2-methoxyethoxymethoxy)ethyl]amine,
tris[2-(1-methoxyethoxy)ethyl]amine,
tris[2-(1-ethoxyethoxy)ethyl]amine,
tris[2-(1-ethoxypropoxy)ethyl]amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4,1-aza-15-crown-5,1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxy)ethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)bis[2-(methoxycarbonyl)ethyl]amine,
N-(2-acetoxyethyl)bis[2-(methoxycarbonyl)ethyl]amine,
N-(2-hydroxyethyl)bis[2-(ethoxycarbonyl)ethyl]amine,
N-(2-acetoxyethyl)bis[2-(ethoxycarbonyl)ethyl]amine,
N-(3-hydroxy-1-propyl)bis[2-(methoxycarbonyl)ethyl]amine,
N-(3-acetoxy-1-propyl)bis[2-(methoxycarbonyl)ethyl]amine,
N-(2-methoxyethyl)bis[2-(methoxycarbonyl)ethyl]amine,
N-butylbis[2-(methoxycarbonyl)ethyl]amine,
N-butylbis[2-(2-methoxyethoxycarbonyl)ethyl]amine,
N-methylbis(2-acetoxyethyl)amine, N-ethylbis(2-acetoxyethyl)amine,
N-methylbis(2-pivaloyloxyethyl)amine,
N-ethylbis[2-(methoxycarbonyloxy)ethyl]amine,
N-ethylbis[2-(tert-butoxycarbonyloxy)ethyl]amine,
tris(methoxycarbonylmethyl)amine,
tris(ethoxycarbonylmethyl)amine,
N-butylbis(methoxycarbonylmethyl)amine,
N-hexylbis(methoxycarbonylmethyl)amine, and
β-(diethylamino)-δ-valerolactone.

The basic compounds may be used alone or in admixture of two or more. From the standpoint of sensitivity, the basic compound may be formulated in an amount of 0 to 3 parts, and preferably 0.01 to 1 part by weight per 100 parts by weight of the silicone structure-bearing polymer.

In the chemically amplified negative resist composition, any optional additives may be added to the photo-curable resin composition used to form a photo-curable resin layer. Suitable additives include a surfactant commonly used for improving the coating operation, and a light absorber commonly used for enhancing the photo-absorption efficiency of a PAG or the like.

Of the surfactants, nonionic surfactants are preferred, for example, fluorochemical surfactants including perfluoroalkylpolyoxyethylene ethanols, fluorinated alkyl esters, perfluoroalkylamine oxides, and fluorinated organosiloxane compounds. Useful surfactants are commercially available under the trade names Fluorad FC-4430 from 3M-Sumitomo Co., Ltd., Surflon S-141 and S-145 from Asahi Glass Co., Ltd., Unidyne DS-401, DS-4031 and DS-451 from Daikin Industry Co., Ltd., Megaface F-8151 from DIC Corp., and X-70-093 from Shin-Etsu Chemical Co., Ltd. Preferred surfactants are Fluorad FC-4430 from 3M-Sumitomo Co., Ltd. and X-70-093 from Shin-Etsu Chemical Co., Ltd.

Suitable light absorbers include diaryl sulfoxide, diaryl sulfone, 9,10-dimethylanthracene, and 9-fluorenone.

The chemically amplified negative resist composition may be prepared by a standard procedure. It is typically prepared by combining the selected components, stirring, and filtering through a filter.

Pattern formation using the resist composition of the invention may be carried out by a known lithographic technique. For example, the resist composition is applied onto a substrate (such as a silicon wafer, $SiO_2$ substrate, SiN substrate, substrate having a pattern of copper lines formed thereon or substrate having electrodes of Al or the like formed thereon) by spin coating or the like and pre-baked on a hot plate at 80 to 130° C. for 50 to 600 seconds to form a resist film having a thickness of 1 to 50 μm, preferably 1 to 30 μm, and more preferably 5 to 20 μm. A photomask having the desired pattern is then placed over the resist film, and the film exposed through the mask to high-energy radiation of wavelength up to 500 nm such as i or g-line in a dose of about 1 to 5,000 $mJ/cm^2$, and preferably about 100 to 2,000 $mJ/cm^2$. This may be optionally followed by bake (PEB) on a hot plate at 60 to 150° C. for 1 to 10 minutes, and preferably at 80 to 120° C. for 1 to 5 minutes. Through exposure, the exposed region is crosslinked and insolubilized in a developer.

The resist film is then developed in a developer. The developer used herein may be the solvent which is used in the preparation of the negative resist composition. Preferably the developer is selected from alcohols such as isopropyl alcohol (IPA), ketones such as cyclohexanone, and glycols such as propylene glycol monomethyl ether. The development may be carried out in a conventional manner, for example, by immersing the resist film-bearing substrate in the developer. This is followed by optional cleaning, rinsing and drying, obtaining a film in the form of a photo-curable resin layer having the desired pattern. Where a pattern need not be formed, for example, merely a uniform film is to be formed, the same procedure as the above pattern forming procedure may be employed except that the photomask is not used.

Further, the thus patterned film may be post-cured by heating in an oven or on a hot plate at a temperature of 100 to 250° C., preferably 150 to 220° C., and more preferably 170 to 190° C. The post-cure temperature of 100 to 250° C. is sufficient to increase the crosslinking density of the film of the photo-curable resin composition, to remove any residual volatiles, and to enhance adhesion to substrate, heat resistance, strength, and electric properties. The post-cure time may be 10 minutes to 10 hours.

The thus cured film possesses good flexibility, adhesion to substrate, heat resistance, electric properties, mechanical strength, and resistance to chemicals, typically solder flux. When used as protective film, the cured film provides semiconductor devices with reliability and prevents crack formation in a thermal cycling test. The cured film is thus best suited as protective film for electric and electronic parts, semiconductor devices, and the like.

Photo-Curable Dry Film and Pattern Forming Process

A further embodiment of the invention is a photo-curable dry film comprising a photo-curable resin layer having a thickness of 10 to 100 μm sandwiched between a support film and a protective film. The photo-curable resin layer is formed of a photo-curable resin composition which is the negative resist composition defined above.

First, the structure of the photo-curable dry film is described. The photo-curable dry film includes a support film, a protective film, and a photo-curable resin layer sandwiched therebetween. The photo-curable dry film enables to form a resin layer having a widely varying thickness and to form a fine pattern, and post-cure at low temperature leads to improvements in flexibility, heat resistance, electric properties, adhesion, reliability and chemical resistance.

The photo-curable dry film is solid, and eliminates the risk that after the photo-curable resin layer is cured, bubbles resulting from volatilization are left within the resin layer and between the resin layer and the rugged substrate surface. Although the advancement of semiconductor devices toward small size, thin profile and multilayer stacking brings in the tendency that the interlayer dielectric layer to which the invention is applicable is thinner, an appropriate thickness range exists for the layer when planarity and step coverage on rugged substrate surface are taken into account. Accordingly, from the standpoints of planarity and step coverage, the photo-curable resin layer should have a thickness of 10 to 100 μm, preferably 10 to 70 μm, and more preferably 10 to 50 μm.

In general, the photo-curable dry film has the nature that as the temperature exceeds a certain level by heating, the photo-curable resin layer begins crosslinking reaction, known as dark reaction, and cures even without light irradiation. However, dark reaction does not substantially take place in the specific temperature range as defined herein, indicating that this temperature range does not adversely affect the fluidity of the photo-curable resin layer. Furthermore, the viscosity and fluidity of the photo-curable resin layer are closely correlated. That is, the photo-curable resin layer within a proper viscosity range exhibits a sufficient fluidity to fill deeply even in a narrow gap.

Accordingly, the photo-curable dry film has the advantage that when tightly attached to a substrate having asperities on its surface, the photo-curable resin layer is coated so as to conform to the asperities, achieving high planarity. Particularly because the photo-curable resin layer is composed mainly of a photo-curable silicone composition, higher planarity is achievable owing to the advantage of low surface tension. Further, if the photo-curable resin layer is in close contact with the substrate in a vacuum environment, generation of gaps therebetween is effectively inhibited.

Next, the method of preparing photo-curable dry film and the pattern forming process using the photo-curable dry film are described.

In the photo-curable dry film, the photo-curable resin composition used to form the photo-curable resin layer may be prepared like the chemically amplified negative resist composition defined above, specifically by combining the selected components, stirring, and filtering through a filter.

The support film used in the photo-curable dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET 38×1-A3, PET38×1-V8 and PET38×1-X08 from Nippa Co., Ltd.

The protective film used in the photo-curable dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 µm, more preferably 25 to 50 µm, for consistent manufacture of photo-curable dry film, and prevention of wrapping or curling on a take-up roll.

Next, it is described how to manufacture the photo-curable dry film. An apparatus for manufacturing the photo-curable dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support film is unwound from a supply roll in the film coater, passed across the head of the film coater where the photo-curable resin composition is coated onto the support film to the predetermined buildup, and then moved through a hot air circulating oven at a predetermined temperature for a predetermined time, where the photo-curable resin layer is dried on the support film. Thereafter, the support film having the photo-curable resin layer thereon and a protective film which is unwound from another supply roll in the film coater are passed across a laminate roll under a predetermined pressure whereby the protective film is bonded to the photo-curable resin layer on the support film, whereupon the laminate is wound up on a take-up shaft in the film coater. Preferably, the oven temperature is 25 to 150° C., the time is 1 to 100 minutes, and the bonding pressure is 0.01 to 5 MPa.

Further, the pattern forming process using the photo-curable dry film is described. The process involves the steps of stripping the protective film from the photo-curable dry film, placing the bare photo-curable resin layer in close contact with a substrate, exposing the photo-curable resin layer to radiation, bake (PEB), developing and optionally post-curing to form a pattern of the layer. In this way, a protective film for electric and electronic parts is obtained.

Specifically, the photo-curable dry film is first placed in close contact with a substrate using a film attachment apparatus. The substrate used herein may be selected from silicon wafers, TSV silicon wafers, plastic, ceramic and metallic circuit boards. A typical substrate is provided with holes or grooves having an opening width of 10 to 100 µm and a depth of 10 to 120 µm. The film attachment apparatus is preferably a vacuum laminator. The photo-curable dry film is mounted in the film attachment apparatus where the protective film is stripped from the dry film. In the vacuum chamber kept at a predetermined vacuum, the bare photo-curable resin layer of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa. After bonding, any well-known lithography may be performed to form a pattern.

At this point, the assembly of the photo-curable resin layer on the substrate may be prebaked, if necessary, for facilitating photo-cure reaction of the photo-curable resin layer or enhancing the adhesion between the photo-curable resin layer and the substrate. Prebake may be, for example, at 40 to 140° C. for 1 minute to 1 hour. Next, the photo-curable resin layer, with the support film or with the support film stripped off, is exposed to radiation of wavelength 190 to 500 nm through a photomask. The photomask may be, for example, a mask with a desired pattern perforated. The material of the photomask is preferably capable of cutting off radiation of wavelength 190 to 500 nm. For example, chromium or the like is preferably used, but the mask material is not limited thereto. The radiation of wavelength 190 to 500 nm includes radiation of various wavelengths emitted by a radiation emitter, for example, UV radiation such as g and i-lines, and deep UV radiation (193 nm and 248 nm). The preferred wavelength is from 248 nm to 436 nm. The exposure dose is preferably 10 to 3,000 mJ/cm$^2$, for example. Through this exposure, the exposed region is crosslinked and insolubilized in a developer, forming an insolubilized pattern. To enhance the development sensitivity, the layer may be baked (PEB). The PEB may be, for example, 40 to 140° C. for 0.5 to 10 minutes.

This is followed by development in a developer. The developer used herein may be the solvent for the photo-curable resin composition used in the formation of the photo-curable resin layer in the photo-curable dry film. The developer is preferably selected from alcohols such as isopropyl alcohol (IPA), ketones such as cyclohexanone, and glycols such as propylene glycol monomethyl ether. The development may be carried out in a conventional manner, for example, by immersing the resin layer-bearing substrate in the developer. This is followed by optional cleaning, rinsing and drying, obtaining a film in the form of the photo-curable resin layer having the desired pattern. Where a pattern need not be formed, for example, merely a uniform film is to be formed, the same procedure as the above pattern forming procedure may be employed except that the photomask is not used.

Further, the patterned layer may be post-cured by heating in an oven or on a hot plate at a temperature of 100 to 250° C., preferably 150 to 220° C., and more preferably 170 to 190° C. The post-cure temperature of 100 to 250° C. is sufficient to increase the crosslinking density of the layer of the photo-curable resin composition, to remove any residual volatiles, and to enhance adhesion to substrate, heat resistance, strength, and electric properties. The post-cure time may be 10 minutes to 10 hours.

The thus cured film also possesses flexibility, adhesion to substrate, heat resistance, electric properties, mechanical strength, and resistance to chemicals, typically solder flux. When used as protective film, the cured film provides semiconductor devices with reliability and prevents crack formation in a thermal cycling test. The cured film is thus best suited as protective film for electric and electronic parts, semiconductor devices, and the like.

EXAMPLE

Synthesis Examples, Examples and Comparative Examples are given below by way of illustration and not by way of limitation. All parts are by weight (pbw).

I. Preparation of Negative Resist Composition

In Synthesis Examples below, compounds M-1 to M-6 having the chemical structure shown below were used.

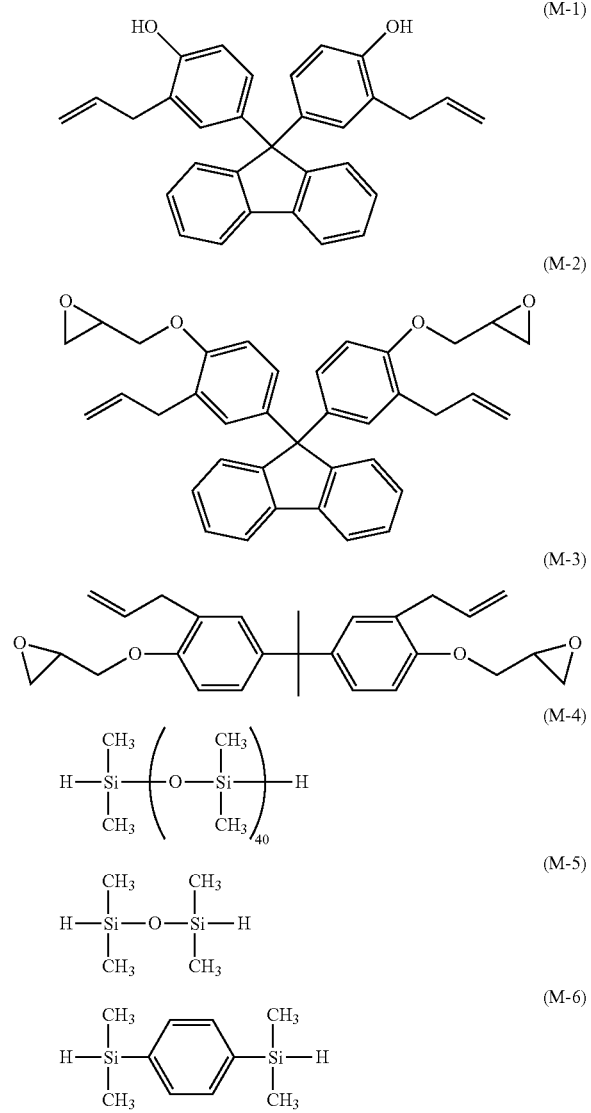

Synthesis Example 1

In a 5-L flask equipped with a stirrer, thermometer, nitrogen purging line and reflux condenser, 396.5 g of compound M-1 was dissolved in 1,668 g of toluene. To the solution, 859.2 g of compound M-4 was added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 78.3 g of compound M-5 was added dropwise over one hour. At this point, the flask internal temperature rose to 79° C. After the dropwise addition, the reaction solution was ripened for 3 hours at 90° C. and then cooled to room temperature. Then 1,550 g of methyl isobutyl ketone was added. The reaction solution was filtered through a filter under pressure to remove the platinum catalyst. To the silicone structure-bearing polymer solution thus obtained, 700 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 2,000 g of cyclopentanone was added. This yielded a silicone structure-bearing polymer solution (A-1) in cyclopentanone having a resin solids concentration of 60 wt %. The silicone structure-bearing polymer in the solution was measured for molecular weight by GPC versus polystyrene standards, finding a Mw of 42,000. The polymer corresponded to formula (1) wherein molar fractions a=0, b=1, c=0, and d=0 as computed from the charges of reactants M-1, M-4 and M-5.

Synthesis Example 2

In a 5-L flask equipped with a stirrer, thermometer, nitrogen purging line and reflux condenser, 352.8 g of compound M-1 and 90.0 g of compound M-3 were dissolved in 1,875 g of toluene. To the solution, 949.6 g of compound M-4 and 6.1 g of compound M-5 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.3 g of compound M-6 was added dropwise over one hour. At this point, the flask internal temperature rose to 79° C. After the dropwise addition, the reaction solution was ripened for 3 hours at 90° C. and then cooled to room temperature. Then 1,700 g of methyl isobutyl ketone was added. The reaction solution was filtered through a filter under pressure to remove the platinum catalyst. To the silicone structure-bearing polymer solution thus obtained, 760 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 980 g of cyclopentanone was added. This yielded a silicone structure-bearing polymer solution (A-2) in cyclopentanone having a resin solids concentration of 60 wt %. The silicone structure-bearing polymer in the solution was measured for molecular weight by GPC versus polystyrene standards, finding a Mw of 64,000. The polymer corresponded to formula (1) wherein molar fractions a=0.480, b=0.320, c=0.120, and d=0.080.

Synthesis Example 3

In a 5-L flask equipped with a stirrer, thermometer, nitrogen purging line and reflux condenser, 352.8 g of compound M-1 and 116.1 g of compound M-2 were dissolved in 1,875 g of toluene. To the solution, 949.6 g of compound M-4 and 6.1 g of compound M-5 were added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 107.3 g of compound M-6 was added dropwise over one hour. At this point, the flask internal temperature rose to 73° C. After the dropwise addition, the reaction solution was ripened for 3 hours at 90° C. and then cooled to room temperature. Then 1,700 g of methyl isobutyl ketone was added. The reaction solution was filtered through a filter under pressure to remove the platinum catalyst. To the silicone structure-bearing polymer solution thus obtained, 760 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 2,250 g of cyclopentanone was added. This yielded a silicone structure-bearing polymer solution (A-3) in cyclopentanone having a resin solids concentration of 60 wt %. The silicone structure-bearing polymer in the solution was measured for molecular weight by GPC versus polystyrene standards, finding a Mw of 55,000. The polymer corresponded to formula (1) wherein molar fractions a=0.486, b=0.314, c=0.114, and d=0.086.

Synthesis Example 4

In a 5-L flask equipped with a stirrer, thermometer, nitrogen purging line and reflux condenser, 396.5 g of compound M-1 was dissolved in 1,550 g of toluene. To the solution, 859.2 g of compound M-4 was added, and it was heated at 60° C. To the flask, 2.2 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 2.2 g of platinum-on-carbon catalyst (5 wt %) was admitted, and 115.2 g of compound M-6 was added dropwise over one hour. At this point, the flask internal temperature rose to 78° C. After the dropwise addition, the reaction solution was ripened for 10 hours at 90° C. and then cooled to room temperature. Then 1,700 g of methyl isobutyl ketone was added. The reaction solution was filtered through a filter under pressure to remove the platinum catalyst. To the silicone structure-bearing polymer solution thus obtained, 700 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 832 g of cyclopentanone was added. This yielded a silicone structure-bearing polymer solution (A-4) in cyclopentanone having a resin solids concentration of 60 wt %. The silicone structure-bearing polymer in the solution was measured for molecular weight by GPC versus polystyrene standards, finding a Mw of 80,000. The polymer corresponded to formula (1) wherein molar fractions a=0.670, b=0.330, c=0, and d=0.

Synthesis Example 5

Synthesis of tris(3,5-di-tert-butyl-4-hydroxybenzyl)-isocyanuric acid (IC-5)

A 300-mL flask equipped with a stirrer, thermometer, nitrogen purge line, and reflux condenser was charged with 66.0 g (0.32 mol) of 2,6-di-tert-butylphenol, 12.9 g (0.1 mol) of isocyanuric acid, 10.9 g (0.33 mol as formaldehyde) of 92% pure paraformaldehyde, 240 g of methanol, and 30 g of water. Then 6.0 g of triethylamine was added, followed by stirring and heating under reflux for 10 hours. After the completion of reaction, the solvent was distilled off in vacuum. By pouring the residue into acetonitrile for recrystallization, filtering the precipitate, and vacuum drying, tris (3,5-di-tert-butyl-4-hydroxybenzyl)isocyanuric acid was obtained in white crystal form. Yield 93.2%, melting point 218-219° C., and purity 97.5% by high-performance liquid chromatography.

Examples 1 to 14 and Comparative Examples 1 to 8

Resist compositions were prepared from the resin solutions of Synthesis Examples 1 to 4. The resin solution was combined with a crosslinker, PAG, an amine compound, an isocyanuric acid (IC-1 to 5), and cyclopentanone as additional solvent in amounts as shown in Table 1, yielding a resist composition having a resin concentration of 45 wt %. The procedure involved stirring and mixing for dissolution and precision filtration through a Teflon® filter with a pore size of 0.5 μm.

In Comparative Examples, resist compositions were similarly prepared except that the isocyanuric acid was omitted. Specifically, comparative resist compositions were prepared by combining the resin solutions of Synthesis Examples 1 to 4 with a crosslinker, PAG, amine and solvent, stirring and mixing for dissolution and precision filtering through a Teflon® filter with a pore size of 0.5 μm.

TABLE 1

| Photo-curable resin composition | Silicone structure-bearing polymer (pbw) | PAG (pbw) | Cross-linker (pbw) | Basic compound (pbw) | Isocyanuric acid (pbw) |
|---|---|---|---|---|---|
| #1 | A-1 (100) | PAG-1 (0.5) | XL-1 (7) | Amine-1 (0.50) | IC-1 (1.0) |
| #2 | A-1 (100) | PAG-1 (0.5) | XL-1 (7) | Amine-1 (0.50) | IC-1 (5.0) |
| #3 | A-1 (100) | PAG-1 (0.5) | XL-1 (7) | Amine-1 (0.50) | IC-1 (8.0) |
| #4 | A-2 (100) | PAG-1 (0.5) | XL-1 (7) | Amine-1 (0.50) | IC-1 (1.0) |
| #5 | A-3 (100) | PAG-1 (0.5) | XL-1 (7) | Amine-1 (0.50) | IC-1 (1.0) |
| #6 | A-4 (100) | PAG-1 (0.5) | XL-1 (7) | Amine-1 (0.50) | IC-1 (1.0) |
| #7 | A-1 (100) | PAG-2 (1.0) | XL-2 (15) | Amine-1 (0.50) | IC-1 (1.0) |
| #8 | A-2 (100) | PAG-2 (1.0) | XL-2 (15) | Amine-1 (0.50) | IC-1 (1.0) |
| #9 | A-3 (100) | PAG-2 (1.0) | XL-2 (15) | Amine-1 (0.50) | IC-1 (1.0) |
| #10 | A-4 (100) | PAG-2 (1.0) | XL-2 (15) | Amine-1 (0.50) | IC-1 (1.0) |
| #11 | A-4 (100) | PAG-1 (0.5) | XL-1 (7) | Amine-1 (0.50) | IC-2 (1.0) |
| #12 | A-4 (100) | PAG-1 (0.5) | XL-1 (7) | Amine-1 (0.50) | IC-3 (1.0) |

TABLE 1-continued

| Photo-curable resin composition | Silicone structure-bearing polymer (pbw) | PAG (pbw) | Cross-linker (pbw) | Basic compound (pbw) | Isocyanuric acid (pbw) |
|---|---|---|---|---|---|
| #13 | A-4 (100) | PAG-1 (0.5) | XL-1 (7) | Amine-1 (0.50) | IC-4 (1.0) |
| #14 | A-4 (100) | PAG-1 (0.5) | XL-1 (7) | Amine-1 (0.50) | IC-5 (3.0) |
| #15 | A-1 (100) | PAG-1 (0.5) | XL-1 (7) | Amine-1 (0.50) | nil |
| #16 | A-2 (100) | PAG-1 (0.5) | XL-1 (7) | Amine-1 (0.50) | nil |
| #17 | A-3 (100) | PAG-1 (0.5) | XL-1 (7) | Amine-1 (0.50) | nil |
| #18 | A-4 (100) | PAG-1 (0.5) | XL-1 (7) | Amine-1 (0.50) | nil |
| #19 | A-1 (100) | PAG-2 (1.0) | XL-2 (15) | Amine-1 (0.50) | nil |
| #20 | A-2 (100) | PAG-2 (1.0) | XL-2 (15) | Amine-1 (0.50) | nil |
| #21 | A-3 (100) | PAG-2 (1.0) | XL-2 (15) | Amine-1 (0.50) | nil |
| #22 | A-4 (100) | PAG-2 (1.0) | XL-2 (15) | Amine-1 (0.50) | nil |

The acid generators PAG-1 and PAG-2, crosslinkers XL-1 and XL-2, and basic compound Amine-1 in Table 1 are identified below.

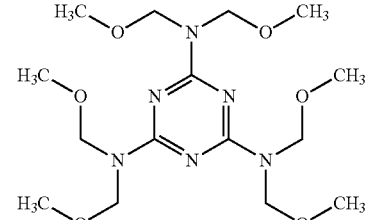

PAG-1

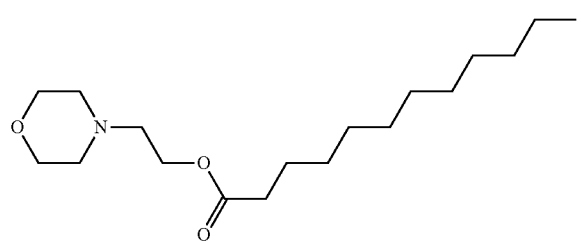

PAG-2

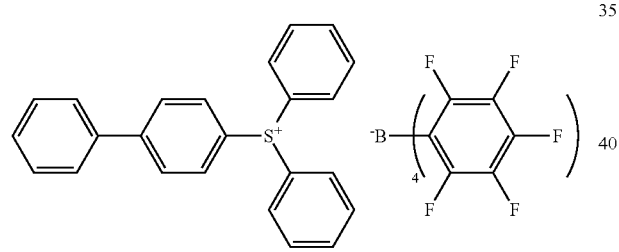

XL-1

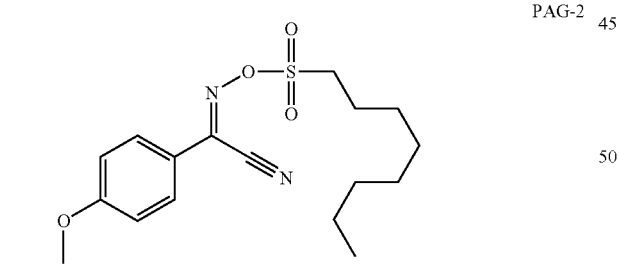

XL-2

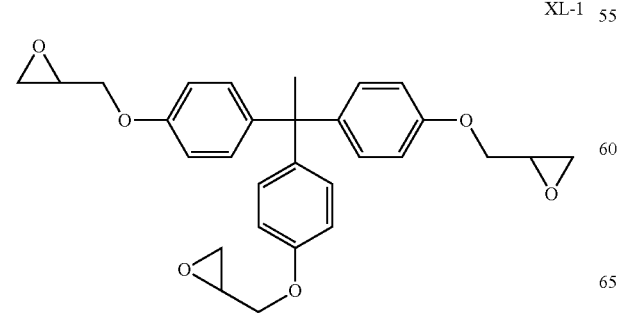

Amine-1

The isocyanuric acids IC-1 to 5 in Table 1 are identified below.

triglycidylisocyanuric acid
(Tokyo Chemical Industries Co., Ltd.)

IC-1

monoallyldiglycidylisocyanuric acid
(Shikoku Chemicals Corp.)

IC-2

diallylmonoglycidylisocyanuric acid
(Shikoku Chemicals Corp.)

IC-3

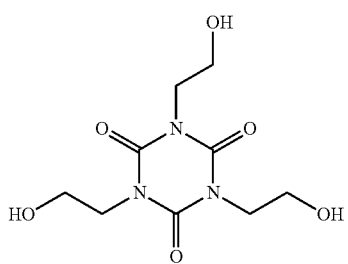

tris(hydroxyethyl)isocyanuric acid
(Wako Pure Chemical Industries, Ltd.)

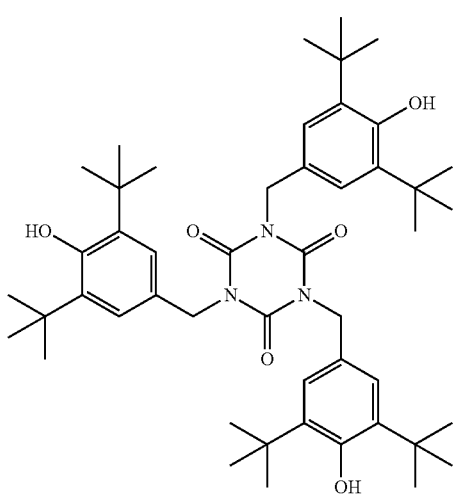

tris(3,5-di-tert-butyl-4-hydroxybenzyl)-isocyanuric acid
(Synthesis Example 5)

II. Exposure and Pattern Formation

The resist composition was coated onto a silicon substrate by spin coating. Specifically, 5 mL of the resist composition may be dispensed on the substrate, which is then spun. The buildup or thickness of the resist film on the substrate can be easily adjusted by controlling the rotational speed. The resist composition was coated onto the silicon substrate to a thickness of 20 μm.

After the resist composition was dispensed and spin coated onto the substrate, it was prebaked on a hot plate at 100° C. for 2 minutes. Next, using a mask aligner MA-8 (SUSS MicroTec AG) with a mask having a 1:1 column/row matrix of 20-μm holes, the resist film was exposed to a broad band of radiation (365 nm). The substrate was baked (PEB) at 110° C. for 2 minutes and cooled. Then puddle development in isopropyl alcohol (IPA) for 1 minute was repeated 3 times for patterning the resist film. The patterned film on the substrate was post-cured in an oven at 180° C. for 2 hours while the oven was purged with nitrogen.

The resist film was similarly patterned using a SiN substrate and a Cu substrate instead of the silicon substrate.

To observe the cross-sectional profile of the resulting hole pattern, each substrate was sectioned. The profile of the hole pattern was observed under a scanning microscope (SEM). Table 2 reports the optimum dose (dose computed as 365-nm radiation) at which the hole pattern was finished to the same size (or diameter) of holes as the mask size of 20 μm.

TABLE 2

| | Photo-curable resin composition | Dose (mJ/cm$^2$) on silicon | Dose (mJ/cm$^2$) on SiN | Dose (mJ/cm$^2$) on Cu |
|---|---|---|---|---|
| Example 1 | #1 | 1200 | 1500 | 1700 |
| Example 2 | #2 | 1600 | 1800 | 1900 |
| Example 3 | #3 | 1800 | 1900 | 2000 |
| Example 4 | #4 | 1300 | 1500 | 1700 |
| Example 5 | #5 | 1200 | 1500 | 1700 |
| Example 6 | #6 | 1300 | 1500 | 1800 |
| Example 7 | #7 | 500 | 700 | 700 |
| Example 8 | #8 | 700 | 700 | 800 |
| Example 9 | #9 | 600 | 700 | 800 |
| Example 10 | #10 | 700 | 800 | 800 |
| Example 11 | #11 | 1200 | 1500 | 1700 |
| Example 12 | #12 | 1300 | 1500 | 1700 |
| Example 13 | #13 | 1500 | 1700 | 1800 |
| Example 14 | #14 | 1500 | 1800 | 2000 |
| Comparative Example 1 | #15 | 1200 | pattern stripped on development | pattern stripped on development |
| Comparative Example 2 | #16 | 1300 | pattern stripped on development | pattern stripped on development |
| Comparative Example 3 | #17 | 1200 | pattern stripped on development | pattern stripped on development |
| Comparative Example 4 | #18 | 1300 | pattern stripped on development | pattern stripped on development |
| Comparative Example 5 | #19 | 500 | pattern stripped on development | pattern stripped on development |
| Comparative Example 6 | #20 | 700 | pattern stripped on development | pattern stripped on development |
| Comparative Example 7 | #21 | 600 | pattern stripped on development | pattern stripped on development |
| Comparative Example 8 | #22 | 700 | pattern stripped on development | pattern stripped on development |

As seen from Table 2, in an attempt to pattern a film of isocyanuric acid-free resist composition on the SiN and Cu substrates, the film substantially stripped off, that is, patterning was impossible. It is demonstrated that the addition of the isocyanuric acid to a resist composition is effective for improving the patterning of the composition and the adhesion between the film and the substrate.

Examples 15 to 28 and Comparative Examples 9 to 16

These Examples are intended to manufacture photo-curable dry films. Photo-curable resin compositions were prepared from the resin solutions of Synthesis Examples 1 to 4. The resin solution was combined with a crosslinker, PAG, amine compound and isocyanuric acid (IC-1 to 5) in amounts as shown in Table 1 (no extra cyclopentanone as solvent). The procedure involved stirring and mixing for dissolution and precision filtration through a Teflon® filter with a pore size of 1.0 μm.

In Comparative Examples, photo-curable resin compositions were similarly prepared except that the isocyanuric acid was omitted. Specifically, comparative photo-curable resin compositions were prepared by combining the resin solutions of Synthesis Examples 1 to 4 with a crosslinker, PAG, amine compound and solvent, stirring and mixing for dissolution and precision filtering through a Teflon® filter with a pore size of 1.0 μm.

III. Manufacture of Photo-Curable Dry Film

A die coater was used as the film coater and a polyethylene terephthalate (PET) film of 38 μm thick used as the support film. Each of photo-curable resin compositions #1 to #12 in Table 1 was coated onto the support film to a coating thickness of 50 μm. The coated film was passed through a hot air circulating oven (length 4 m) set at 100° C. over 5 minutes, forming a photo-curable resin layer on the support film. Using a laminating roll, a PET film of 50 μm thick as the protective film was bonded to the photo-curable resin layer under a pressure of 1 MPa, yielding a photo-curable dry film.

IV. Exposure and Pattern Formation

From each of the photo-curable dry films using the photo-curable resin compositions in Examples and Comparative Examples as tabulated in Table 3, the protective film was stripped off. Using a vacuum laminator TEAM-100RF (Takatori Corp.) with a vacuum chamber set at a vacuum of 100 Pa and a temperature of 100° C., the photo-curable resin layer on the support film was closely bonded to a silicon substrate. After restoration of atmospheric pressure, the substrate was cooled to 25° C. and taken out of the laminator. The support film was stripped off.

After the support film was stripped off, the photo-curable resin layer on substrate was prebaked on a hot plate at 100° C. for 5 minutes. Next, using a mask aligner MA-8 (SUSS MicroTec AG) with a mask having a 1:1 column/row matrix of 40-μm holes, the resin layer was exposed to a broad band of radiation. The substrate was baked (PEB) at 130° C. for 5 minutes and cooled. This was followed by spray development in propylene glycol monomethyl ether acetate (PGMEA) for 5 minutes for patterning the resin layer. The patterned layer on the substrate was post-cured in an oven at 180° C. for 2 hours while the oven was purged with nitrogen.

The photo-curable dry film was similarly laminated and patterned using a SiN substrate and a Cu substrate instead of the silicon substrate.

To observe the cross-sectional profile of the resulting hole pattern, each substrate was sectioned. The profile of the hole pattern was observed under SEM. Table 3 reports the optimum dose (dose computed as 365-nm radiation) at which the hole pattern was finished to the same size (or diameter) of holes as the mask size of 40 μm.

TABLE 3

| | Photo-curable resin composition | Dose (mJ/cm$^2$) on silicon | Dose (mJ/cm$^2$) on SiN | Dose (mJ/cm$^2$) on Cu |
| --- | --- | --- | --- | --- |
| Example 15 | #1 | 1300 | 1600 | 1800 |
| Example 16 | #2 | 1700 | 1900 | 2000 |
| Example 17 | #3 | 1900 | 2000 | 2100 |
| Example 18 | #4 | 1400 | 1600 | 1800 |
| Example 19 | #5 | 1300 | 1600 | 1800 |
| Example 20 | #6 | 1400 | 1600 | 1900 |
| Example 21 | #7 | 600 | 800 | 800 |
| Example 22 | #8 | 800 | 800 | 900 |
| Example 23 | #9 | 700 | 800 | 900 |
| Example 24 | #10 | 800 | 900 | 900 |
| Example 25 | #11 | 1300 | 1700 | 1800 |
| Example 26 | #12 | 1400 | 1600 | 1800 |
| Example 27 | #13 | 1600 | 2000 | 2100 |
| Example 28 | #14 | 1600 | 1900 | 2200 |
| Comparative Example 9 | #15 | 1300 | pattern stripped on development | pattern stripped on development |
| Comparative Example 10 | #16 | 1400 | pattern stripped on development | pattern stripped on development |
| Comparative Example 11 | #17 | 1300 | pattern stripped on development | pattern stripped on development |
| Comparative Example 12 | #18 | 1400 | pattern stripped on development | pattern stripped on development |
| Comparative Example 13 | #19 | 600 | pattern stripped on development | pattern stripped on development |
| Comparative Example 14 | #20 | 800 | pattern stripped on development | pattern stripped on development |
| Comparative Example 15 | #21 | 700 | pattern stripped on development | pattern stripped on development |
| Comparative Example 16 | #22 | 800 | pattern stripped on development | pattern stripped on development |

As seen from Table 3, in an attempt to laminate and pattern a photo-curable dry film comprising an isocyanuric acid-free resist composition on the SiN and Cu substrates, the film substantially stripped off, that is, patterning was impossible. It is demonstrated that the addition of the isocyanuric acid to a resist composition is effective for improving the patterning of the photo-curable dry film and the adhesion between the pattern (or film) and the substrate.

V. Filling Capability

There were provided 6-inch silicon wafers which each were perforated with 200 circular holes having an opening diameter of 10 to 100 μm (increment 10 μm) and a depth of 10 to 120 μm (increment 10 μm). The photo-curable dry films of Examples 20, 25 and 26 were chosen from Table 3. The protective film was stripped off from each of the photo-curable dry films. Using a vacuum laminator TEAM-100RF (Takatori Corp.) with a vacuum chamber set at a vacuum of 100 Pa and a temperature of 100° C., the photo-curable resin layer on the support film was closely bonded to the silicon substrate. After restoration of atmospheric pressure, the substrate was cooled to 25° C. and taken out of the laminator. The support film was stripped off.

After the support film was stripped off, the photo-curable resin layer on substrate was prebaked on a hot plate at 100° C. for 5 minutes. Next, using a mask aligner MA-8 (SUSS MicroTec AG), the resin layer was exposed to a broad band of radiation in a dose (dose computed as 365-nm radiation) as shown in Table 4. The substrate was baked (PEB) at 110° C. for 5 minutes and cooled. This was followed by spray development in PGMEA for 5 minutes for patterning the resin layer. The patterned layer on the substrate was post-cured in an oven at 180° C. for 2 hours while the oven was purged with nitrogen.

The substrate was diced so that the circular holes might be viewed in cross section. The cross section of the circular holes was observed under SEM to inspect whether or not voids were left. The results are reported in Table 4.

TABLE 4

| | Photo-curable resin composition | Dose (mJ/cm$^2$) | Cross section of circular holes observed |
| --- | --- | --- | --- |
| Example 20 | #6 | 1500 | no voids, fully filled |
| Example 25 | #11 | 1500 | no voids, fully filled |
| Example 26 | #12 | 1500 | no voids, fully filled |

As seen from Table 4, the holes were fully filled without leaving voids. It is demonstrated that the photo-curable dry film, specifically photo-curable resin layer exhibits satisfactory filling or embedment as the electric/electronic part-protecting film.

VI. Electric Properties (Dielectric Breakdown Strength)

The photo-curable dry films of Examples 18, 19 and 20 (resin layer thickness 50 μm) were chosen from Table 3. After the protective film was stripped off, the photo-curable resin layer on the support film was closely bonded to a substrate (according to JIS K-6249) at a temperature of 100° C. The assembly was cooled to room temperature, after which the support film was stripped off. The photo-curable resin layer on substrate was prebaked on a hot plate at 100° C. for 5 minutes. Next, using the mask aligner, the resin layer was exposed to a broad band of radiation in a dose of 1,000 mJ/cm$^2$ (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen. The substrate having the cured layer thereon was measured for dielectric breakdown strength according to JIS K-6249, with the results shown in Table 5.

As seen from Table 5, all the layers had satisfactory electric property as the electric/electronic part-protecting film.

VII. Adhesion

The photo-curable dry films of Examples 18, 19 and 20 (resin layer thickness 50 μm) were chosen from Table 3. The protective film was stripped off. Using the vacuum laminator, the photo-curable resin layer on the support film was closely bonded to a neat 6-inch silicon wafer in a vacuum chamber set at a vacuum of 100 Pa and a temperature of 100° C. After restoration of atmospheric pressure, the substrate was cooled to 25° C. and taken out of the laminator. The support film was stripped off. Thereafter, the photo-curable resin layer on substrate was prebaked on a hot plate at 100° C. for 5 minutes. Next, using the mask aligner, the resin layer was exposed to a broad band of radiation in a dose of 1,000 mJ/cm$^2$ (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen, yielding a patterned post-cured film having pattern features with a diameter of 300 μm and a height of 50 μm. The patterned post-cured film was evaluated for initial adhesion by peeling the film from the substrate and measuring the reaction force. The measurement conditions included a bond tester (Dage series 4000-PXY by Dage), a speed of 50.0 μm/sec, and a height of 3.0 μm.

FIG. 1 schematically illustrates how to evaluate adhesion or bond strength. A patterned post-cured film 2 is borne on a silicon substrate 1. A jig 3 of the bond tester is moved in the direction of arrow 4 to push the film. Measurements at 15 points were averaged. A higher value indicates greater adhesion of the patterned post-cured film to the substrate.

Further, a solder flux fluid was applied to the patterned post-cured film on the substrate. The film was heated at 220° C. for 30 seconds, cooled, washed with deionized water, and dried at room temperature for 2 hours. After this degradation test, the patterned post-cured film was evaluated for adhesion again by using the bond tester, peeling the film from the substrate and measuring the reaction force.

For the three photo-curable dry films, adhesion was evaluated by comparing their initial values, and chemical resistance (against solder flux) was also evaluated by comparing their adhesion behavior that the bond strength decreases from the initial value to the post-degradation value. The results are shown in Table 5.

As seen from Table 5, the layers had satisfactory adhesion as the electric/electronic part-protecting film.

VIII. Crack Resistance

The photo-curable dry films of Examples 18, 19 and 20 (resin layer thickness 50 μm) were chosen from Table 3. The protective film was stripped off. Using the vacuum laminator, the photo-curable resin layer on the support film was closely bonded to a substrate (used in the filling test) in a vacuum chamber at a vacuum of 100 Pa and a temperature of 100° C. After restoration of atmospheric pressure, the substrate was cooled to 25° C. and taken out of the laminator. The support film was stripped off.

Thereafter, the photo-curable resin layer on substrate was prebaked on a hot plate at 100° C. for 5 minutes. Next, using the mask aligner, the resin layer was exposed to a broad band of radiation in a dose of 1,000 mJ/cm$^2$ (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen.

The substrate having the cured film thereon was placed in a thermal cycling tester where thermal cycling between −55° C. and +150° C. was repeated until 1,000 cycles. During the test, the cured film was observed whether or not cracks formed. The results are shown in Table 5.

As seen from Table 5, the layers had satisfactory crack resistance as the electric/electronic part-protecting film.

IX. Resistance to Stripper

The photo-curable dry films of Examples 18, 19 and 20 (resin layer thickness 50 μm) were chosen from Table 3. The protective film was stripped off. Using the vacuum laminator, the photo-curable resin layer on the support film was closely bonded to a neat 6-inch silicon wafer in a vacuum chamber at a vacuum of 100 Pa and a temperature of 100° C. After restoration of atmospheric pressure, the substrate was cooled to 25° C. and taken out of the laminator. The support film was stripped off.

Thereafter, the photo-curable resin layer on substrate was prebaked on a hot plate at 100° C. for 5 minutes. Next, using the mask aligner, the resin layer was exposed to a broad band of radiation in a dose of 1,000 mJ/cm$^2$ (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen, yielding a cured film having a pattern of 15 mm×15 mm squares. The film was immersed in N-methylpyrrolidone (NMP) at room temperature for 1 hour. By examining film thickness change and outer appearance, the film was evaluated for stripper resistance. The results are shown in Table 5.

As seen from Table 5, all the layers had satisfactory stripper resistance as the electric/electronic part-protecting film.

TABLE 5

|  | Dielectric breakdown strength (V/μm) | Adhesion (mN) | | Crack resistance after thermal cycling | Stripper resistance after immersion in NMP |
| --- | --- | --- | --- | --- | --- |
|  |  | Initial | Degraded |  |  |
| Example 18 | 400 | 320 | 220 | no cracks | appearance and thickness unchanged |
| Example 19 | 400 | 440 | 410 | no cracks | appearance and thickness unchanged |
| Example 20 | 300 | 300 | 210 | no cracks | appearance and thickness unchanged |

The invention substantially overcomes the stripping problem that can be encountered on metal wirings and electrodes, semiconductor substrates and SiN substrates. The chemically amplified negative resist composition, photo-curable dry film and pattern forming process according to the invention can form a film having a wide range of thickness and form a fine pattern using radiation over a wide span of wavelength, can reduce the size of pattern features in the redistribution layer technology to meet the demand for chips of higher density and higher integration, and are useful to form an electric/electronic part-protecting film.

Japanese Patent Application No. 2011-270001 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising
   (A) a resin having a crosslinking group or a reaction site susceptible to crosslinking reaction within the molecule,
   (B) a crosslinker,
   (C) a photoacid generator which is decomposed to generate an acid upon exposure to light of wavelength 190 to 500 nm,
   (D) a solvent, and
   (E) an isocyanuric acid of the structure having the general formula (1):

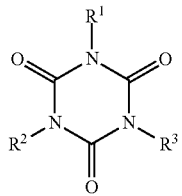
(1)

wherein $R^1$, $R^2$ and $R^3$ may be the same or different, at least one of $R^1$, $R^2$ and $R^3$ is a crosslinking group or a monovalent organic group having a reaction site susceptible to crosslinking reaction and the remaining is a monovalent hydrocarbon group of 1 to 20 carbon atoms;
    wherein component (A) is a silicone structure-bearing polymer comprising recurring units of the general formula (2) and having a weight average molecular weight of 3,000 to 500,000,

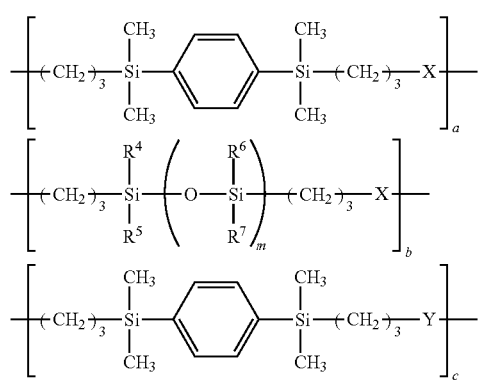
(2)

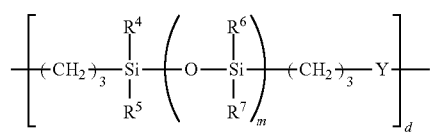

wherein $R^4$ to $R^7$ are each independently a monovalent $C_1$-$C_8$ hydrocarbon group, m is an integer of 1 to 100, a, b, c and d each are 0 or a positive number, with the proviso that a, b, c and d are not equal to 0 at the same time, and a+b+c+d=1, X is a divalent organic group of the general formula (3):

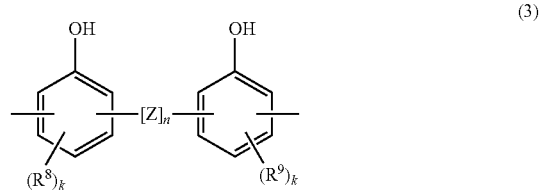
(3)

wherein Z is a divalent organic group selected from the following:

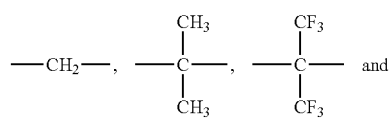

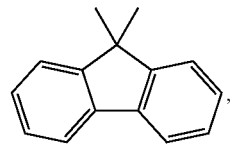

n is 0 or 1, $R^8$ and $R^9$ are each independently $C_1$-$C_4$ alkyl or alkoxy, and k is 0, 1, or 2, and Y is a divalent organic group of the general formula (4):

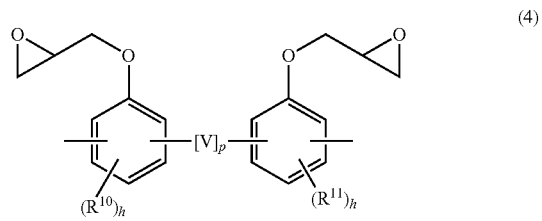
(4)

wherein V is a divalent organic group selected from the following:

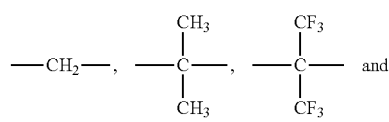

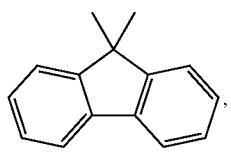

p is 0 or 1, $R^{10}$ and $R^{11}$ are each independently $C_1$-$C_4$ alkyl or alkoxy, and h is 0, 1, or 2, and component (B) is at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group substituted by a glycidoxy group.

2. The resist composition of claim 1 wherein $0.3 \leq a \leq 0.7$, $0.2 \leq b \leq 0.5$, $0 < c \leq 0.2$, and $0 < d \leq 0.2$ in formula (2).

3. The resist composition of claim 1 wherein $0.2 \leq a \leq 0.8$, $0.2 \leq b \leq 0.8$, $c=0$, and $d=0$ in formula (2).

4. The resist composition of claim 1 wherein $b=1$, and a, c and d are 0 in formula (2).

5. The resist composition of claim 1 wherein component (E) is an isocyanuric acid of the structure having formula (1) wherein at least one of $R^1$, $R^2$ and $R^3$ is a crosslinking group selected from methylol, alkoxymethylol, glycidyl, and vinyloxy groups, or an organic group having a reaction site susceptible to crosslinking reaction, represented by the general formula (5) or (6):

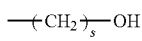
(5)

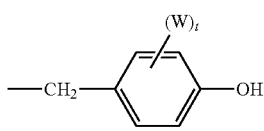
(6)

wherein s is an integer of 1 to 3, W is a straight or branched $C_1$-$C_4$ alkyl group, and t is 0 or an integer of 1 to 4.

6. The resist composition of claim 1 wherein the isocyanuric acid of component (E) is selected from the group consisting of compounds having the following formulae (I) to (V):

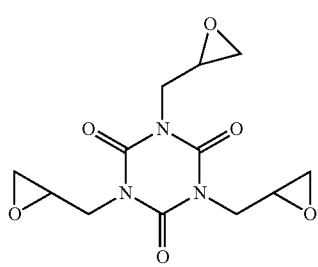
(I)

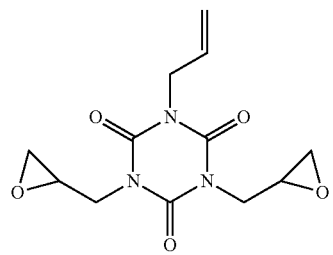
(II)

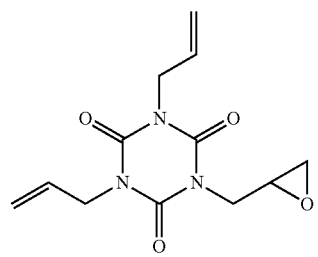
(III)

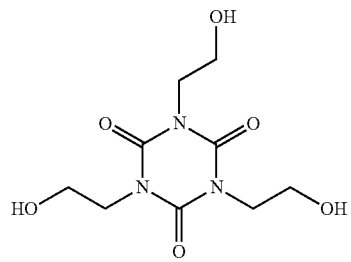
(IV)

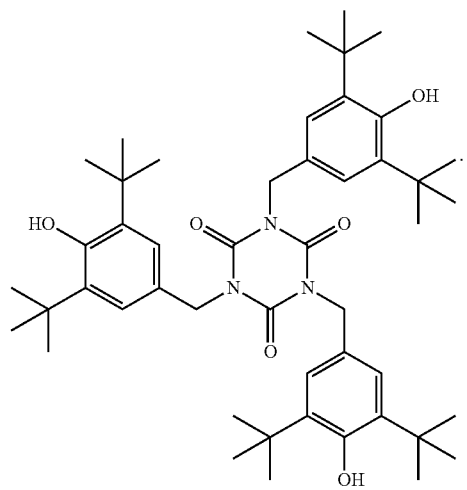
(V)

7. The resist composition of claim 1, further comprising a basic compound.

8. A pattern forming process comprising the steps of:
(1) coating the chemically amplified negative resist composition of claim 1 onto a substrate, and prebaking to form a resist film,
(2) exposing the resist film to high-energy radiation of wavelength 190 to 500 nm through a photomask or electron beam,
(3) baking and developing in a developer to pattern the resist film.

9. The process of claim 8, further comprising (4) post-curing the patterned resist film resulting from development step (3) at a temperature of 100 to 250° C.

10. A photo-curable dry film comprising a photo-curable resin layer having a thickness of 10 to 100 μm sandwiched between a support film and a protective film,
the photo-curable resin layer being formed of a photo-curable resin composition which is the chemically amplified negative resist composition of claim 1.

11. A laminate comprising
a substrate provided with grooves and/or holes having an opening width of 10 to 100 μm and a depth of 10 to 120 μm, and
a layer lying on the substrate, the layer being a cured layer of the photo-curable resin composition obtained from the photo-curable dry film of claim 10 by removing the protective film and the support film.

12. A pattern forming process comprising the steps of:
(i) stripping the protective film from the photo-curable dry film of claim 10 and placing the bare photo-curable resin layer in close contact with a substrate,
(ii) exposing the photo-curable resin layer to radiation of wavelength 190 to 500 nm through a photomask and through the support film or with the support film stripped off,
(iii) post-exposure bake, and
(iv) developing in a developer to pattern the layer.

13. The process of claim 12, further comprising (v) post-curing the patterned layer resulting from development step (iv) at a temperature of 100 to 250° C.

14. The process of claim 12 wherein the substrate is provided with grooves and/or holes having an opening width of 10 to 100 μm and a depth of 10 to 120 μm.

15. A film for the protection of electric and electronic parts, which is obtained from the photo-curable dry film of claim 10.

16. A method of preparing a photo-curable dry film, comprising the steps of:
(i) coating a photo-curable resin composition onto a support film, the photo-curable resin composition being the resist composition comprising components (A) to (E) as set forth in claim 1,
(ii) drying the photo-curable resin composition to form a photo-curable resin layer on the support film, and
(iii) applying a protective film onto the photo-curable resin layer.

* * * * *